US011145287B2

(12) United States Patent
Hsu et al.

(10) Patent No.: US 11,145,287 B2
(45) Date of Patent: Oct. 12, 2021

(54) SYSTEMS AND METHODS FOR USING DYNAMIC NOISE GENERATION TO ENHANCE USER ACOUSTIC EXPERIENCE

(71) Applicant: Dell Products L.P., Round Rock, TX (US)

(72) Inventors: Claire H. Hsu, Santa Clarita, CA (US); Travis C. North, Cedar Park, TX (US); Robert E. Freehill, Florence, TX (US); Douglas J. Peeler, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/573,763

(22) Filed: Sep. 17, 2019

(65) Prior Publication Data

US 2021/0082385 A1 Mar. 18, 2021

(51) Int. Cl.
| | | |
|---|---|---|
| G10K 11/175 | (2006.01) | |
| G10K 15/04 | (2006.01) | |
| G05B 15/02 | (2006.01) | |
| H05K 3/04 | (2006.01) | |
| G06F 1/20 | (2006.01) | |
| H04R 3/04 | (2006.01) | |
| H05K 7/20 | (2006.01) | |

(52) U.S. Cl.
CPC ............ *G10K 11/175* (2013.01); *G05B 15/02* (2013.01); *G06F 1/20* (2013.01); *G10K 15/04* (2013.01); *H04R 3/04* (2013.01); *H05K 7/20172* (2013.01)

(58) Field of Classification Search
CPC ............ G10K 11/175; G10K 11/1752; G10K 11/1754; G10K 11/172; G10K 11/178; G10K 11/1781; G10K 11/17823; G10K 11/1785; G10K 11/17873; G10K 11/17883; G10K 15/04; G10K 15/043; G05B 13/00; G05B 19/00; G05B 11/00; G05B 15/00; G05B 15/02; G06F 1/20; G06F 1/203; G06F 1/206; H04R 3/04; H04R 3/06; H04R 3/08; H05K 7/20172; G10F 1/20
USPC .. 381/28, 59, 55, 317, 318, 321, 74, 72, 26, 381/56, 57, 71.1–71.13, 83, 332, 93, 96, 381/97, 98, 99, 100, 101, 102, 103, 106, 381/107, 108, 120, 121, 73.1; 700/94; 327/551, 552, 553, 555, 556, 560; 704/E21.005; 379/406.01–406.16
See application file for complete search history.

(56) References Cited

U.S. PATENT DOCUMENTS

| | | | | |
|---|---|---|---|---|
| 10,133,321 | B1 * | 11/2018 | Bhopte | .............. H05K 7/20736 |
| 10,629,182 | B1 * | 4/2020 | Layton | ................. H04R 29/001 |
| 2005/0094823 | A1 * | 5/2005 | Kobori | ............. G10K 11/17853 381/71.5 |
| 2006/0067537 | A1 * | 3/2006 | Breitbach | ........ G10K 11/17823 381/59 |
| 2015/0110283 | A1 * | 4/2015 | Cheng | ..................... H04R 3/02 381/71.1 |

* cited by examiner

*Primary Examiner* — Leshui Zhang
(74) *Attorney, Agent, or Firm* — Jackson Walker L.L.P.

(57) ABSTRACT

An information handling system may include an air mover configured to cause movement of gaseous fluid within the information handling system in order to thermally cool one or more components of the information handling system and a dynamic noise generation system configured to receive an indication of expected acoustical energy generated by the air mover and generate sound in accordance with an output noise signal based on noise generated by the air mover.

15 Claims, 2 Drawing Sheets

SYSTEMS AND METHODS FOR USING DYNAMIC NOISE GENERATION TO ENHANCE USER ACOUSTIC EXPERIENCE

TECHNICAL FIELD

The present disclosure relates in general to information handling systems, and more particularly to systems and methods for using dynamic noise generation to enhance user acoustic experience, for example dynamic generation of noise in the presence of sound generated by an air mover, to minimize a user's negative perception of the noise generated by the air mover.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, air movers (e.g., cooling fans and blowers) have often been used in information handling systems to cool information handling systems and their components.

One disadvantage of existing approaches to thermal control of information handling systems is that oftentimes, air movers generate undesired acoustic noise that may be offensive to a user of the information handling system. Existing approaches to thermal control of information handling systems may not effectively minimize undesirable acoustic noise while providing sufficient cooling of resources of an information handling system. Accordingly, more effective solutions to minimize undesirable acoustic noise from air movers are desired.

SUMMARY

In accordance with the teachings of the present disclosure, the disadvantages and problems associated with generation of undesirable noise in information handling systems may be substantially reduced or eliminated.

In accordance with embodiments of the present disclosure, an information handling system may include an air mover configured to cause movement of gaseous fluid within the information handling system in order to thermally cool one or more components of the information handling system and a dynamic noise generation system configured to receive an indication of expected acoustical energy generated by the air mover and generate sound in accordance with an output noise signal based on noise generated by the air mover.

In accordance with these and other embodiments of the present disclosure, a method may include receiving an indication of expected acoustical energy generated by an air mover configured to cause movement of gaseous fluid within an information handling system in order to thermally cool one or more components of the information handling system and generating sound in accordance with an output noise signal based on noise generated by the air mover.

In accordance with these and other embodiments of the present disclosure, an article of manufacture, may include a non-transitory computer readable medium and computer-executable instructions carried on the computer readable medium, the instructions readable by a processor, the instructions, when read and executed, for causing the processor to receive an indication of expected acoustical energy generated by an air mover configured to cause movement of gaseous fluid within an information handling system in order to thermally cool one or more components of the information handling system and generate sound in accordance with an output noise signal based on noise generated by the air mover.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 3B, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, buses, memories, I/O devices and/or interfaces, storage resources, network interfaces, motherboards, integrated circuit packages; electro-mechanical devices (e.g., air movers), displays, and power supplies.

Figure 1:
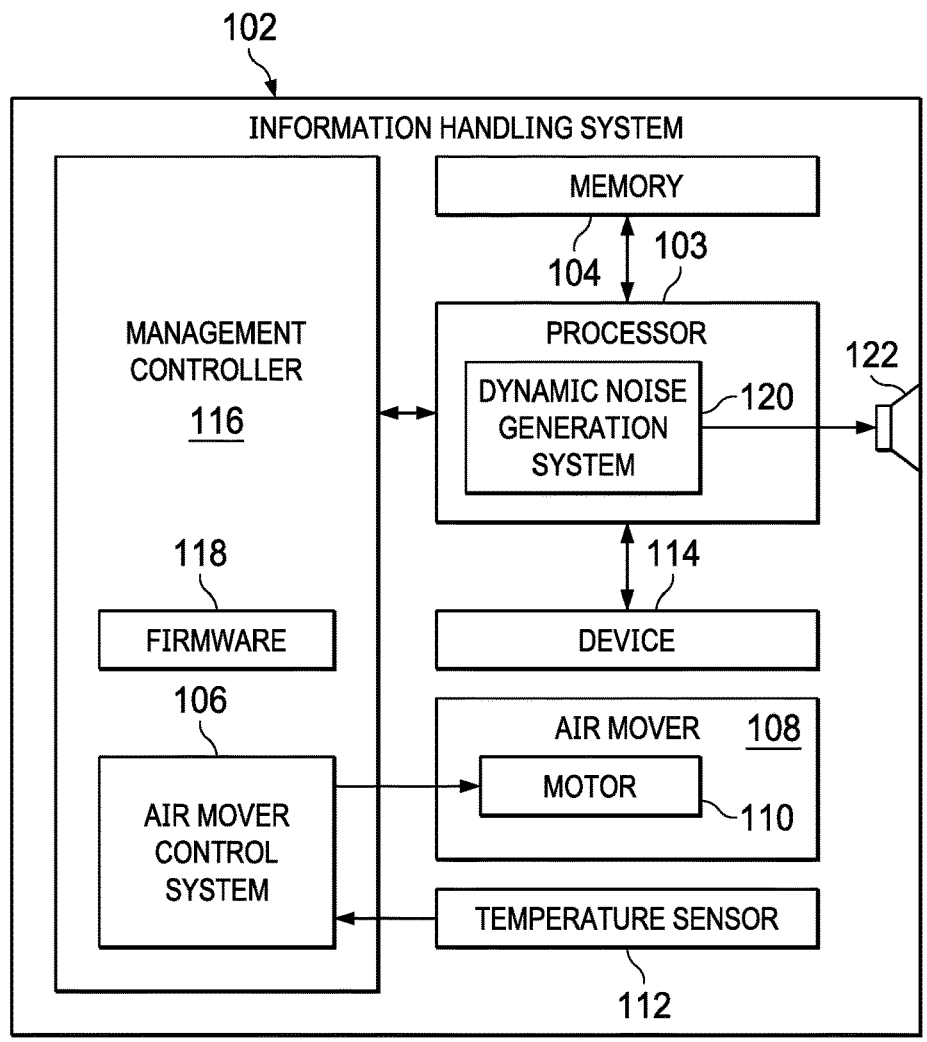
FIG. 1 illustrates a block diagram of an example information handling system, in accordance with embodiments of the present disclosure.

FIG. 1 illustrates a block diagram of an example information handling system 102, in accordance with the present disclosure. In some embodiments, information handling system 102 may comprise a server chassis configured to house a plurality of servers or "blades." In other embodiments, information handling system 102 may comprise a personal computer (e.g., a desktop computer, laptop computer, mobile computer, and/or notebook computer). In yet other embodiments, information handling system 102 may comprise a storage enclosure configured to house a plurality of physical disk drives and/or other computer-readable media for storing data. As shown in FIG. 1, an information handling system 102 may comprise a processor 103, a memory 104 communicatively coupled to processor 103, an air mover 108 communicatively coupled to an air mover control system 106 (e.g., which may be implemented by a management controller 116), a temperature sensor 112 communicatively coupled to air mover control system 106, one or more devices 114 communicatively coupled to processor 103, an audio transducer 122, and management controller 116 communicatively coupled to processor 103.

Processor 103 may comprise any system, device, or apparatus operable to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

As shown in FIG. 1, processor 103 may implement a dynamic noise generation system 120. Dynamic noise generation system 120 may comprise a program of instructions executable by processor 103. In some embodiments, dynamic noise generation system 120 may be stored in computer-readable media accessible to processor 103 (e.g., memory 104 or other computer-readable media accessible to processor 103), and may be loaded from such computer-readable media to be executed by processor 103. In these and other embodiments, dynamic noise generation system 120 may be implemented as part of an operating system of information handling system 102. Alternatively, dynamic noise generation system 120 may be implemented as a driver or application program that executes on an operating system of information handling system 102. When executed, dynamic noise generation system 120 may cause audio transducer 122 to generate noise based on operating characteristics of air mover 108 (e.g., speed of motor 110 and acoustical properties of air mover 108) in order to enhance user acoustic experience, as described in greater detail below.

Memory 104 may be communicatively coupled to processor 103 and may comprise any system, device, or apparatus operable to retain program instructions or data for a period of time. Memory 104 may comprise random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to information handling system 102 is turned off.

Air mover 108 may be communicatively coupled to air mover control system 106, and may include any mechanical or electro-mechanical system, apparatus, or device operable to move air and/or other gases. In some embodiments, air mover 108 may comprise a fan (e.g., a rotating arrangement of vanes or blades which act on the air). In other embodiments, air mover 108 may comprise a blower (e.g., a centrifugal fan that employs rotating impellers to accelerate air received at its intake and change the direction of the airflow). In these and other embodiments, rotating and other moving components of air mover 108 may be driven by a motor 110. The rotational speed of motor 110 may be controlled by the air mover control signal communicated from air mover control system 106. In operation, air mover 108 may cool information handling resources of information handling system 102 by drawing cool air into an enclosure housing the information handling resources from outside the chassis, expel warm air from inside the enclosure to the outside of such enclosure, and/or move air across one or more heatsinks (not explicitly shown) internal to the enclosure to cool one or more information handling resources.

A temperature sensor 112 may be any system, device, or apparatus (e.g., a thermometer, thermistor, etc.) configured to communicate a signal to air mover control system 106 indicative of a temperature within information handling system 102.

Audio transducer 122 may include any system, device, or apparatus configured to receive an audio signal and generate acoustical energy (e.g., human-perceptible sound) as a function of such received audio signal. Accordingly, audio transducer 122 may comprise a voice-coil-based loudspeaker, a piezoelectric transducer, a linear resonant actuator, or any other device suitable to output acoustical energy. For the purposes of clarity or exposition, no audio amplifier is shown in FIG. 1. However, it is understood that an audio amplifier configured to drive audio transducer 122 may be integral to audio transducer 122 or may be interfaced between processor 103 and audio transducer 122 to amplify a signal generated by processor 103 and drive audio transducer 122 with such amplified signal.

For ease of exposition, FIG. 1 depicts only one each of air mover control system 106, air mover 108, temperature sensor 112, and audio transducer 122. However, it is noted that information handling system 102 may include two or more air movers 108 and each such air mover 108 may have a dedicated respective air mover control system 106. It is further noted that an air mover control system 106 may receive temperature signals from one or more temperature sensors 112, and that a single temperature sensor 112 may communicate temperature signals to one or more air mover control systems 106. It is additionally noted that information handling system 102 may include two or more audio transducers 122 for outputting acoustic sound.

Device 114 may be communicatively coupled to processor 103 and may generally include any information handling resource.

Management controller 116 may be configured to provide out-of-band management facilities for management of information handling system 102. Such management may be made by management controller 116 even if information handling system 102 is powered off or powered to a standby state. Management controller 116 may include a processor, memory, out-of-band network interface separate from and physically isolated from an in-band network interface of information handling system 102, and/or other embedded information handling resources. In certain embodiments, management controller 116 may include or may be an integral part of a baseboard management controller (BMC) or a remote access controller (e.g., a Dell Remote Access Controller or Integrated Dell Remote Access Controller). In other embodiments, management controller 116 may include or may be an integral part of a chassis management controller (CMC).

As shown in FIG. 1, management controller 116 may include firmware 118 and air mover control system 106. Firmware 118 may include a program of executable instructions configured to be read and executed by management controller 118 in order to carry out the functionality of management controller 118, including that functionality described herein.

Air mover control system 106 may include any system, device, or apparatus configured to receive one or more signals indicative of one or more temperatures within information handling system 102 (e.g., one or more signals from one or more temperature sensors 112), and based on such signals, determine an air mover driving signal to maintain an appropriate level of cooling, increase cooling, or decrease cooling, as appropriate, and communicate such air mover driving signal to air mover 108. Although FIG. 1 depicts air mover control system 106 integral to management controller 116, in some embodiments, air mover control system 106 may be external to and independent from management controller 116. In addition, although FIG. 1 depicts air mover control system 106 independent from firmware 118, in some embodiments, air mover control system 106 may be implemented within firmware 118.

Figure 2:
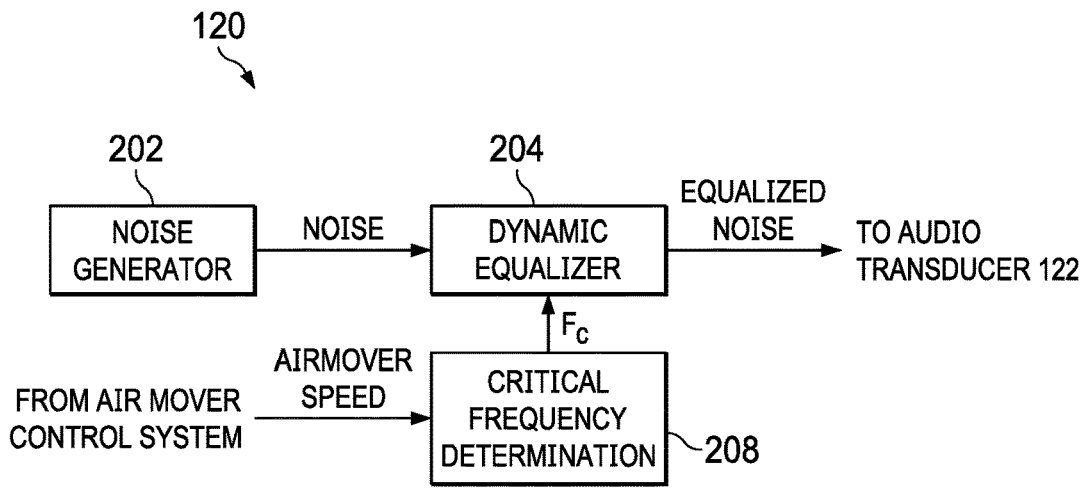
FIG. 2 illustrates selected components of a functional block diagram of a dynamic noise generation system, in accordance with embodiments of the present disclosure.
Figure 3A:
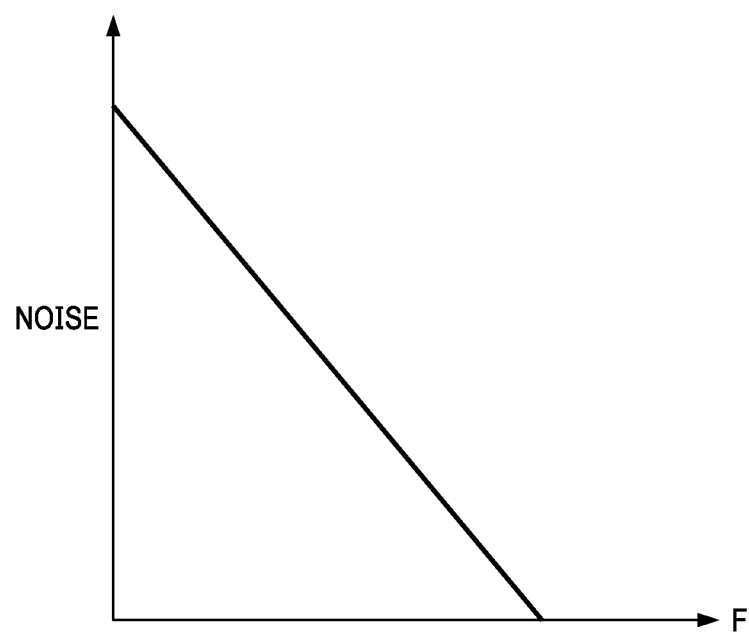
FIG. 3A illustrates a graph of a noise signal as a function of frequency, in accordance with embodiments of the present disclosure.
Figure 3B:
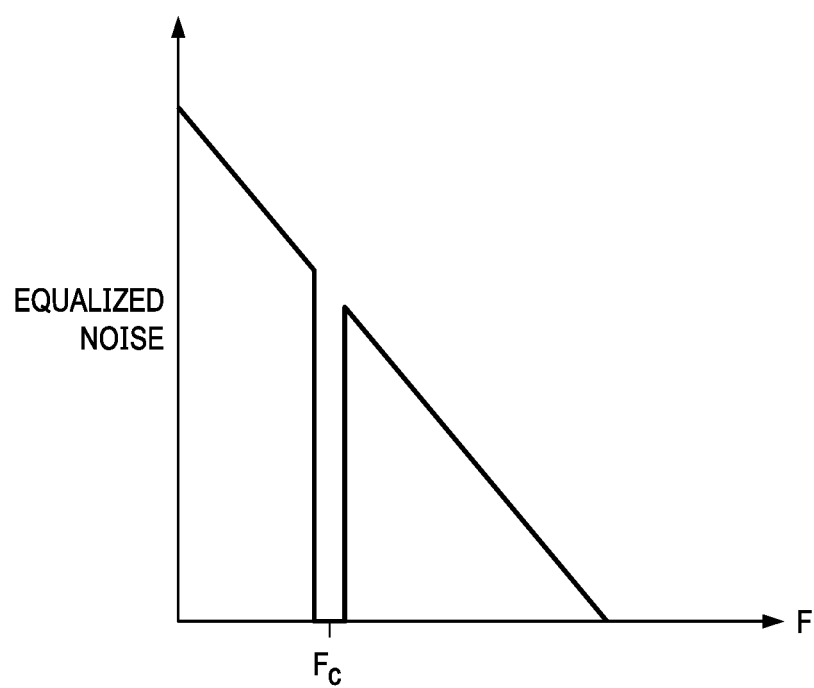
FIG. 3B illustrates a graph of an equalized noise signal as a function of frequency, in accordance with embodiments of the present disclosure.

FIG. 2 illustrates selected components of a functional block diagram of dynamic noise generation system 120, in accordance with embodiments of the present disclosure. As shown in FIG. 2, dynamic noise generation system 120 may be implemented as a noise generator 202, a dynamic equalizer 204, and a critical frequency determination block 208.

Noise generator 202 may be configured to generate a desired noise signal NOISE. For example, in some embodiments, noise generator 202 may generate noise signal NOISE as pink noise, also known as 1/f noise, wherein such noise has power spectral density of the form:

$$\text{NOISE}(f) \propto (1/f^\alpha)$$

where f is frequency, and $0<\alpha<2$, with exponent $\alpha$ usually close to 1. However, in some embodiments, noise generator 202 may generate other noise signals, such as white noise, red (Brownian) noise, or grey noise.

Dynamic equalizer 204 may receive noise signal NOISE and perform frequency-based equalization on noise signal NOISE based on a critical frequency Fc communicated from critical frequency determination block 208 to dynamic equalizer 204 in order to generate an equalized noise signal EQUALIZED NOISE. Generally speaking, dynamic equalizer 204 may be configured to perform filtering on noise signal NOISE such that spectral content of equalized noise signal EQUALIZED NOISE at or near critical frequency Fc is attenuated as compared with noise signal NOISE. For example, dynamic equalizer 204 may in some embodiments implement a notch filter centered at critical frequency Fc, as demonstrated in FIG. 3B which depicts the pink noise signal of FIG. 3A being notch filtered at critical frequency Fc.

Critical frequency determination block 208 may receive an indication of a speed associated with motor 110 of air mover 108 (e.g., from air mover control system 106) and/or one or more other parameters that may be indicative of sound generated by air mover 108, and based thereon, determine critical frequency Fc based on an acoustic profile of air mover 108. For example, critical frequency Fc may represent, for a given air mover speed, an acoustic frequency at which most of or a significant portion of acoustical energy generated by air mover 108 occurs. Accordingly, critical frequency determination block 208 may be configured to map a given speed of motor 110 to a critical frequency Fc corresponding to such speed. In some embodiments, such mapping may be implemented by a lookup table having entries wherein each entry maps a given speed of motor 110 to a corresponding critical frequency Fc. In such embodiments, critical frequency determination block 208 may be configured to interpolate a critical frequency Fc when the speed of motor 110 is between two index entries of the lookup table. In other embodiments, a polynomial or other mathematical formula may be used to translate a given speed of motor 110 to a corresponding critical frequency Fc.

Accordingly, a goal of dynamic noise generation system 120 is to generate an acoustically-pleasing noise signal NOISE SIGNAL, but dynamically equalize such noise signal to account for acoustic energy generated by air mover 108, such that the sum of dynamically equalized noise signal EQUALIZED NOISE and the acoustic energy generated by air mover 108 is approximately equal to noise signal NOISE SIGNAL, such that a user of information handling system 102 perceives hearing acoustically-pleasing noise signal NOISE SIGNAL (or noise approximating such acoustically-pleasing noise signal NOISE SIGNAL).

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An information handling system comprising:
an air mover configured to cause a movement of a gaseous fluid within the information handling system in order to thermally cool one or more components of the information handling system; and
a dynamic noise generation system configured to:
receive an indication of an expected acoustical energy generated by the air mover; and
generate a sound in accordance with an output noise signal, wherein the generated sound is attenuated in a frequency range associated with the expected acoustical energy generated by the air mover, such that the generated sound is audible at non-attenuated frequencies and an acoustical energy generated by the air mover is audible in the frequency range at which the generated sound is attenuated, such that a sum of the generated sound and the expected acoustical energy generated by the air mover approximates a pink noise.

2. The information handling system of claim 1, wherein the indication of the expected acoustical energy generated by the air mover comprises an indication of a speed associated with the air mover.

3. The information handling system of claim 2, wherein the dynamic noise generation system is further configured to:
determine a critical frequency of the expected acoustical energy generated by the air mover based on the speed; and
generate the output noise signal based on the critical frequency.

4. The information handling system of claim 3, wherein generating the output noise signal based on the critical frequency comprises applying a dynamic equalization filter to a pink noise signal to generate the output noise signal, wherein the dynamic equalization filter attenuates the pink noise signal at the critical frequency in order to generate the output noise signal.

5. The information handling system of claim 4, wherein the dynamic equalization filter comprises a notch filter centered at the critical frequency.

6. A method comprising:
receiving an indication of an expected acoustical energy generated by an air mover configured to cause a movement of a gaseous fluid within an information handling system in order to thermally cool one or more components of the information handling system; and
generating a sound in accordance with an output noise signal, wherein the generated sound is attenuated in a frequency range associated with the expected acoustical energy generated by the air mover, such that the generated sound is audible at non-attenuated frequencies and an acoustical energy generated by the air mover is audible in the frequency range at which the generated sound is attenuated, such that a sum of the generated sound and the expected acoustical energy generated by the air mover approximates a pink noise.

7. The method of claim 6, wherein the indication of the expected acoustical energy generated by the air mover comprises an indication of a speed associated with the air mover.

8. The method of claim 7, further comprising:
determining a critical frequency of the expected acoustical energy generated by the air mover based on the speed; and generating the output noise signal based on the critical frequency.

9. The method of claim 8, wherein generating the output noise signal based on the critical frequency comprises applying a dynamic equalization filter to a pink noise signal to generate the output noise signal, wherein the dynamic equalization filter attenuates the pink noise signal at the critical frequency in order to generate the output noise signal.

10. The method of claim 9, wherein the dynamic equalization filter comprises a notch filter centered at the critical frequency.

11. An article of manufacture, comprising;
a non-transitory computer readable medium; and
computer-executable instructions carried on the non-transitory computer readable medium, the computer-executable instructions configured to cause a processor to:
  receive an indication of an expected acoustical energy generated by an air mover configured to cause a movement of a gaseous fluid within an information handling system in order to thermally cool one or more components of the information handling system; and
generate a sound in accordance with an output noise signal, wherein the generated sound is attenuated in a frequency range associated with the expected acoustical energy generated by the air mover, such that the generated sound is audible at non-attenuated frequencies and an acoustical energy generated by the air mover is audible in the frequency range at which the generated sound is attenuated, such that a sum of the generated sound and the expected acoustical energy generated by the air mover approximates a pink noise.

12. The article of manufacture of claim 11, wherein the indication of the expected acoustical energy generated by the air mover comprises an indication of a speed associated with the air mover.

13. The article of manufacture of claim 12, the instructions for further causing the processor to:
  determine a critical frequency of the expected acoustical energy generated by the air mover based on the speed; and
  generate the output noise signal based on the critical frequency.

14. The article of manufacture of claim 13, wherein generating the output noise signal based on the critical frequency comprises applying a dynamic equalization filter to a pink noise signal to generate the output noise signal, wherein the dynamic equalization filter attenuates the pink noise signal at the critical frequency in order to generate the output noise signal.

15. The article of manufacture of claim 14, wherein the dynamic equalization filter comprises a notch filter centered at the critical frequency.

\* \* \* \* \*